United States Patent [19]

Launay et al.

[11] Patent Number: 5,647,122

[45] Date of Patent: Jul. 15, 1997

[54] MANUFACTURING METHOD FOR AN INTEGRATED CIRCUIT CARD

[75] Inventors: François Launay, Caen; Jacques Venambre, Ifs Plaine, both of France

[73] Assignee: U.S. Philips Corporation, New York, N.Y.

[21] Appl. No.: 490,482

[22] Filed: Jun. 14, 1995

[30] Foreign Application Priority Data

Jun. 15, 1994 [FR] France ................................. 94 07308

[51] Int. Cl.$^6$ .................................................. H05K 3/34
[52] U.S. Cl. ............................... 29/840; 264/272.17
[58] Field of Search ............................. 29/840, 841, 846, 29/852, 860; 264/272.15, 272.17

[56] References Cited

U.S. PATENT DOCUMENTS

| 4,495,232 | 1/1985 | Bauser et al. ........................... 428/41 |
| 4,829,666 | 5/1989 | Haghiri-Tehrani et al. ............... 29/841 |
| 5,013,900 | 5/1991 | Hoppe ................................ 235/492 |

FOREIGN PATENT DOCUMENTS

| 0201952 | 3/1986 | European Pat. Off. . |
| 0226480 | 6/1987 | European Pat. Off. . |
| 0359632 | 3/1990 | European Pat. Off. . |
| 2520541 | 1/1982 | France .......................... G06K 19/04 |
| 2548857 | 7/1983 | France .......................... G06K 19/00 |
| 9213319 | 8/1992 | Germany ..................... G06K 19/077 |
| 9213320 | 8/1992 | Germany ..................... G06K 19/077 |
| 2047474 | 11/1980 | United Kingdom ............ H05K 1/18 |

*Primary Examiner*—P. W. Echols
*Assistant Examiner*—Adrian L. Coley
*Attorney, Agent, or Firm*—Leroy Eason

[57] ABSTRACT

The electronic card comprises an electrically insulating card support provided with a cavity for accommodating an integrated circuit and, on one surface, with metal contact pads which are electrically connected to contacts of the integrated circuit. The invention comprises the steps of: (i) the application by an MID technique (Moulded Interconnection Devices) of electrical conductor tracks, all arranged on the bottom and the lateral walls of the cavity, and each connected to one of the metal contact pads arranged on the surface of the support which comprises the cavity, (ii) the realization of electrical connections connecting the contacts of the integrated circuit arranged in the cavity to the conductor tracks on the bottom of the cavity, and (iii) filling up of the cavity with a protective resin which is subsequently polymerized.

9 Claims, 2 Drawing Sheets

MANUFACTURING METHOD FOR AN INTEGRATED CIRCUIT CARD

BACKGROUND OF THE INVENTION

1. Field of the Invention

The invention relates to a manufacturing and assembling method for an electronic card comprising an electrically insulating card support provided with a cavity for accommodating an integrated circuit and, on one surface, metal contact pads electrically connected to contacts of said integrated circuit.

The invention also relates to the electronic card obtained by this method.

The integrated circuit (or chip) inserted in the cavity of the support may be an electronic memory or a microprocessor of greater surface area than the simple memory.

2. Discussion of the Related Art

The methods used at present for realising electronic chip cards use a printed circuit which is deposited on a support foil, generally made of epoxy glass, polyimide, or polyester, as described, for example, in European Patent EP 0 201 952 B1 in the name of the present Applicant (PHF 85.533). The use of a moulded grid is also known. The support foil or grid carries the external metal contact pads of the card on one of its surfaces, the other surface serves as a support for the electronic chip which is electrically connected to the external contacts through the foil or grid. The material of the support foil and the material used for moulding the grids are insulating materials so as to insulate the external contacts and the internal connections of the electronic chip from one another electrically.

The assembly of the chip card accordingly comprises the following steps:

gluing of the integrated circuit (the chip) on the internal surface of the foil or grid, realisation of electrical connections connecting the chip contacts to external metal contact pads (by means of conductive wires), protecting the chip and the connections by means of a protective resin.

cutting off the electronic module thus formed so as to detach it from the support foil or grid, insertion and gluing of the module in a card support of synthetic resin material (usually PVC, ABS, or polycarbonate) in which an accommodation space (cavity) has previously been realised for accommodating said module with its side which supports the integrated circuit (the chip). This cavity may be realised by moulding, injection-moulding, or by spot-facing.

With these methods, the operation of protecting the electronic chip and the connections is often a delicate one because the thickness of this protection must be perfectly controlled for rendering possible the insertion into the cavity of the card support which has a depth of no more than 650 µm.

The insertion of the electronic module into the card is also delicate and demands very narrow tolerances as to the planeness and lateral position so as to avoid practical problems with the use of card readers, or with the accommodation in the cavity.

On the other hand, the gluing of the electronic module must be very effective so as to comply with torsion and bending test requirements.

Finally, these methods necessitate the use of a foil or grid which contribute considerably to the final cost of the product.

SUMMARY OF THE INVENTION

It is an object of the present invention to reduce the number of process steps in the manufacture and assembly of an integrated circuit card.

It is another object to dispense with the manufacture of an intermediate module formed by a foil or grid supporting the external metal contact pads of the card on one surface and the integrated circuit on the other surface.

Yet another object is to do away with the mechanical positioning constraints for the external metal contact pads on the card.

These objects are achieved and the disadvantages mentioned above of the prior art are attenuated or suppressed thanks to the fact that the method described in the opening paragraph is characterized in that it comprises the following steps:

the application of electrical conductor tracks by an MID (Moulded Interconnection Devices) technique, all provided against the bottom and the lateral walls of said cavity and each connected to one of said metal contact pads arranged on the surface of the support which comprises said cavity, the realisation of electrical connections interconnecting the contacts of the integrated circuit positioned in the cavity and said conductor tracks at the bottom of the cavity, filling up of said cavity with a protective resin which is subsequently polymerized.

The encapsulation of the integrated circuit in a flexible card, which is standardized as to its size and the position of its metal contact pads, is thus obtained by a sequence of a reduced number of comparatively simple operations.

In a preferred embodiment of the method, the step of applying the electrical conductor tracks consists in the application of a catalyst by pad printing in accordance with the configuration desired for the tracks, followed by a metallization through autocatalysis. Preferably, the card support is realised with its cavity by an injection-moulding technique, and it may comprise elevations at the bottom of the cavity in locations designed for the ends of the conductor tracks.

For placing the integrated circuit in the cavity, it is possible to glue said circuit with its base against the bottom of the cavity, after which a conductor wire is soldered between each contact of the integrated circuit and an end of a conductor track so as to realise the electrical connections.

Preferred methods for realising this, however, utilize the flip-chip mounting technique: in a first modification, which is known per se, the connections are realised with solder or with conductive glue in given locations, at the areas of the contacts, and for this purpose the contacts of the integrated circuit are provided with conductive elevations, as are usually the ends of the opposing conductor tracks.

A preferred embodiment uses a flip-chip mounting technique for establishing the electrical connections of the integrated circuit, which connections are realised by gluing in combination with pressure by means of an anisotropically electrically conductive glue in the form of a pre-shaped foil or a paste, in which case the contacts of the integrated circuit are without elevations.

In this modification, it is advantageous for the anisotropic glue to be prepolymerized before the step in which the electrical connections are made, and for its final polymerization to be effected simultaneously with that of said protective resin.

BRIEF DESCRIPTION OF THE DRAWINGS

The following description with reference to the annexed drawings, all given by way of non-limitative example, will render it clear how the invention may be implemented.

DETAILED DESCRIPTION OF THE PREFERRED EMBODIMENTS

Figure 1:
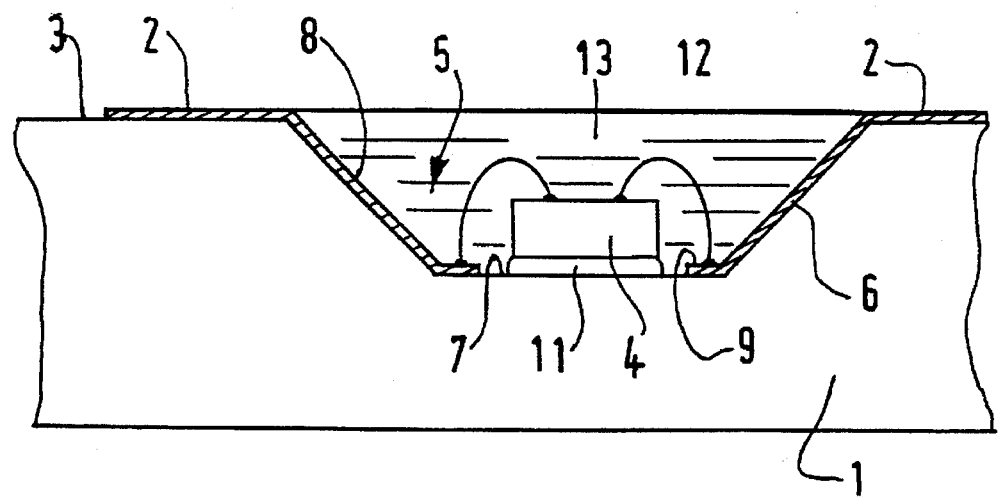
FIGS. 1 and 2 show in cross-section and in plan view, respectively, a broken-away integrated circuit card which may be realised by the method according to the invention.
Figure 2:
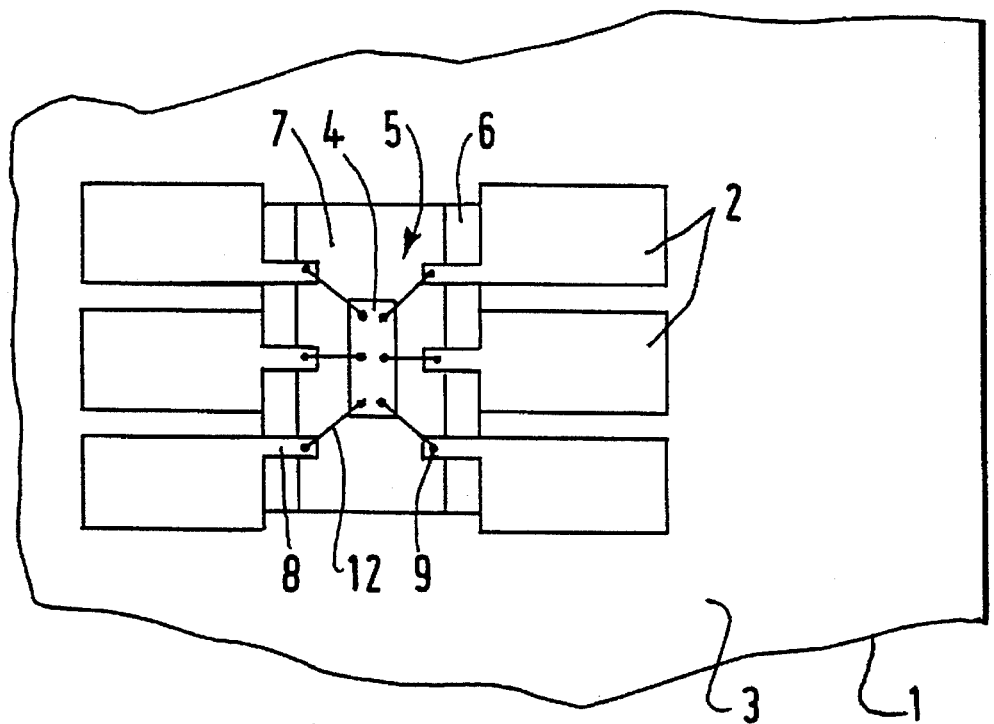

FIGS. 1 and 2 show the active portions of an integrated circuit card where the metal contact pads designed to cooperate with the probes of a card reader are present. The card support 1 comprises these pads 2, which have standardized dimensions and positions, on an upper surface 3 of the card. The metal pads, at least some of them, are electrically connected to contacts of an integrated circuit (or chip) 4 which is present within the thickness of the body or card support 1.

To carry out the method according to the invention, the support I comprises a cavity 5, which has lateral walls which are, for example, oblique as shown with 6, and whose bottom 7 is designed to accommodate the integrated circuit chip 4, and conductor tracks 8 (also called metallization lines) which form an electrical continuity with the pads 2 and extend from the surface 3 of the card body to the bottom 7 of the cavity where their respective free ends 9 are arranged, passing over the lateral walls of the cavity 5, which they traverse. The cavity 5 must have a depth smaller than 650 µm in order to leave a sufficient synthetic resin thickness at the bottom of the card for avoiding a fracture of said bottom of the card and for protecting the electronic chip. Various processes may be used for fixing the tracks 8, substantially made of copper, on the support 1 which is preferably realised with its cavity 5 by injection-moulding from a thermoplastic material such as ABS or polycarbonate. Some of these preferred processes will be described further below. It is also possible to choose from several processes for realising the electrical connections between the contacts of the integrated circuit arranged in the cavity and said conductor tracks at the bottom of the cavity. A conventional method, shown in FIG. 1, consists in mounting of the integrated circuit 4 to the bottom of the cavity 5 by means of a layer of polymerizable glue 11 at its base, usually an epoxy glue, and subsequently soldering conductor wires 12, for example made of gold or aluminium, between the contacts of the integrated circuit 4 and the ends 9 of the conductor tracks. Various mounting and wire bonding processes for the integrated circuit are known to those skilled in the art and are described in numerous publications, among which may be cited the Patents FR 2 439 438, FR 2 548 857, EP 0 116 148, FR 2 520 541. In such a mounting method, when the nickelled base of the integrated circuit forms the ground (earth) terminal, it is so arranged that an end of a track occupies the central portion of the bottom of the cavity (not shown in FIG. 1) and that this metallized base is glued thereon by means of a conductive glue, for example a glue filled with silver to 70% of its volume. The gluing operation may be carried out with standard glues and equipment used in the semiconductor industry (types KS, ESSEC, or other).

The mounting method shown in FIG. 1 is that in which the integrated circuit has all its contacts, including the ground contact, on one and the same surface (the upper surface in FIG. 1).

Gold or aluminium wires may be used for the interconnection by soldering of conductor wires, although the gold wire may be preferred for reasons of speed (the thermosonic process used for soldering gold wires is 3 to 4 times quicker than the soldering of aluminium wires). This operation is the most delicate of the assembling method because it renders necessary a pre-heating of the synthetic resin support. Since it is undesirable that this preheating should exceed the glass transition temperature Tg of the synthetic resin support (deformation risk), it is preferable to use cards made of materials having a high Tg value (polycarbonate, ABS, ABS-PVC compounds or ABS-polycarbonate compounds).

After mounting and gluing of the chip, the operation of filling the cavity 5 may be carded out by a simple potting process which consists in the deposition of a drop of resin 13 in the cavity 5. To obtain a plane external surface, resins of very low viscosity are preferably used, such as, for example, the resin with reference number 931-1 from the American ABLESTICK Company. This resin must have a high ion purity and have a good resistance to water absorption in order to protect the electronic chip effectively during climatic tests. After its application in the cavity the resin is polymerized, which forms the final step in the manufacturing and assembling method according to the invention.

Preferred methods of applying conductor tracks 8 on the support 1 on a non-planar 3-dimensional surface are:

hot foil embossing of a configuration of gluable tracks, pad printing followed by metallization through autocatalysis, lithography based on laser holograms.

Of these three methods, the first two are comparatively well known and proven, comparatively economical, but they do not render possible a high resolution in the realisation of the tracks. Where a high resolution is required, the third method may be used as it is more accurate.

The pad printing and lithographic techniques are compatible with the creation of elevations on the ends 9 of the conductor tracks provided on the bottom of the cavity during injection-moulding of the support 1.

Figure 3:
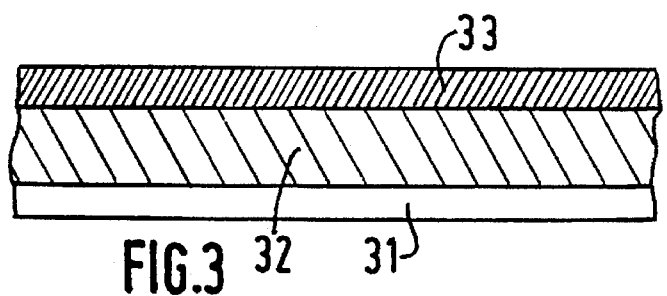
FIG. 3 shows in cross-section the structure of a conductor track provided with a glue which can be reactivated under heat, such as can be used in the method according to the invention.

The contents of Patent EP 0 063 347 may be cited by way of example of the hot foil embossing (or stamping) method. A metal track configuration of 12 to 70 µm thickness may be provided against the card support with a thermal cycle of a duration of the order of 2 s at the area of the cavity 5 of which the shape is designed for this purpose, i.e. preferably with inclined walls, the application pressure being of the order of 80 N/mm$^2$ and the temperature of the order of 200° C. For this purpose, the foils for hot embossing which comprise the track configurations have the structure shown in FIG. 3: one or several layers of glue which can be reactivated by heat 31 (usually a phenol-based glue), having a thickness of 1 to 4 µm, a layer of copper 32, comparatively ductile, with a thickness lying between 12 and 35 µm, and possibly a tin or nickel layer 33 of a few µm thickness. The portion of the foil which is not embossed may subsequently be removed by means of a roller station with an adhesive tape.

In the pad printing process, with a cycle duration of 2 s, a lacquer containing palladium may be imprinted on the card support 1, against the walls and the bottom of the cavity 5, and around the latter on the surface 3 in accordance with the pattern required for the metal track configuration to be created in that location. The printing quality is good because it is possible here to obtain an accuracy of the order of 50 μm for the conductor track width and for the interspacings between tracks.

The lacquer containing Pd, which forms a catalyst and which is deposited on the support 1 in suitable locations, is subsequently heated to 100° C. Then a metallization (copper or nickel) is achieved by autocatalysis, the latter operation having been known and tested for a long time: the copper (nickel) is deposited on the support 1 exclusively in locations where the catalyst is present. The copper thickness deposited lies between 1 and 10 μm. The main advantage of this electrochemical metallization process is that several thousands to several tens of thousands of cards may be treated simultaneously, immersed together in the same bath, in the space of a few hours.

If a higher accuracy is necessary for the pattern of conductor tracks in the cavity 5, it is possible to use a photolithographical process, which is more expensive than the preceding ones. This technique involves the transposition of the conventional photolithographical technique for metallizing plane surfaces to the metallization of skew surfaces, in this case the walls and the bottom of the cavity 5 and its immediate surroundings on the surface 3 of the support. For this purpose, a focusing technique through 3D masks or a laser hologram has been developed, which involves the realisation of the image of tracks in three dimensions on a surface which coincides with that of the cavity, which renders it possible to obtain the polymerization of a varnish exclusively in regions on the surface of the cavity where this is wanted.

For example, a semi-additive process may be used for realising the tracks. This process, which is at present used in the main developed countries, comprises a treatment of the synthetic resin support for improving the adhesion of a deposited metal, preferably copper, on which subsequently electrical contact layers are made to grow with the use of a photoresist mask. After exposure, the mask and the layers around the contacts are eliminated. This process thus renders possible metallizations on non-planar supports through the use of 3D masks or laser techniques (generation of holograms), and provides a resolution of the order of 50 μm. With the various metallization processes mentioned above, the electrical contacts are no longer supported by a foil or grid, as in the prior art, but by the card support itself. In addition, the operations for providing through-holes through an insulating material for establishing the contacts are no longer necessary.

Figures 4A, 4B:
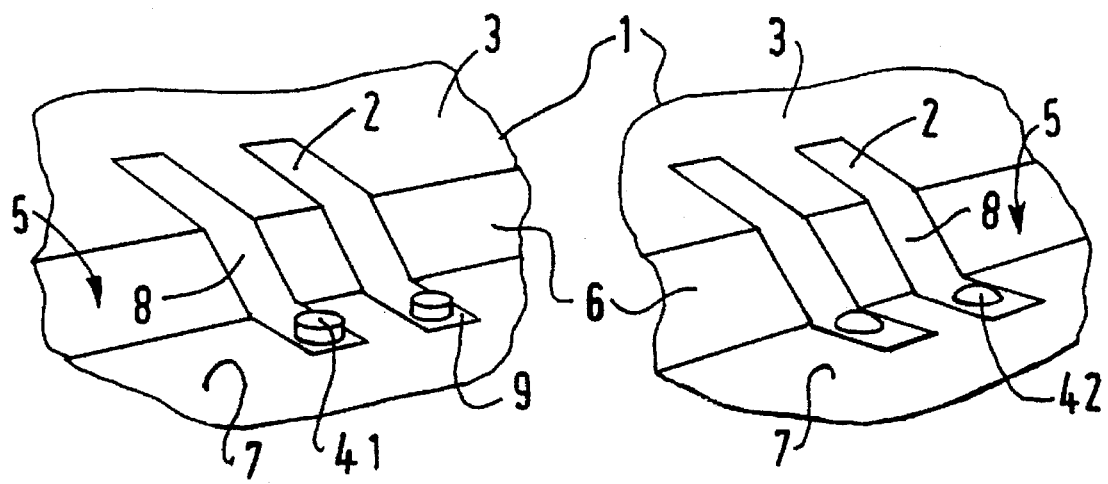
FIGS. 4A and 4B show in broken-away perspective view the creation of elevations at the ends of the conductor tracks.

Besides the conventional mounting technique shown in FIG. 1, where the ground contact is arranged on the same surface of the integrated circuit as the other contacts, which is increasingly the case, a preferred technique as described below is that of flip-chip mounting. For this purpose, the ends 9 of the conductor tracks 8 may comprise elevations whose configuration is symmetrical (relative to a plane) with that of the chip contacts with which they are to cooperate. Such elevations, diagrammatically indicated in FIGS. 4A and 4B, are preferably realised during moulding of the card support 1: their shape may be cylindrical as at 41, FIG. 4A, or have the shape of a spherical bulge 42, FIG. 4B, while the height is a few tens of μm. The metallization of the elevations 41 or 42 may be effected simultaneously with that of the tracks 8 by the pad printing or lithographical processes described above.

According to known, conventional flip-chip mounting processes, the contacts of the integrated circuit, made of aluminium, must be provided with elevations before mounting, which elevations are made of gold or copper through electroplating (which implies a delicate positioning operation of the integrated circuit after its manufacture) or by soldering of gold bumps by means of a conventional thermosonic gold soldering unit. Several processes are available for mounting, which involves the fixed interconnection two-by-two of the elevations of the chip and those of the conductor tracks so that a good electrical contact is established: quick heating of the chip in combination with pressure, which results in each pair of elevations being brazed together; or alternatively the application of a pressure in combination with ultrasonic vibration at 60 kHz induced by the press which supports the chip (known since a long time for soldering conductor wires). A third connection process uses a conductive glue, for example an epoxy glue charged with 70% silver, previously deposited in the form of calibrated droplets exactly on the elevations at the ends of the conductor tracks, or on the elevations of the component through immersion of said elevations in a glue reservoir. These conventional techniques have not been depicted or described so as to keep the description brief. They are described, in particular, in the Patent Applications WO 92/13319 and WO 92/13320. An insulating glue may also be used, which means that the deposition need not be carried out exactly on the metal elevations provided on the metallization pads of the component. In that case, a drop of insulating glue is deposited on the bottom of the cavity before the component is provided. During the prepolymerization of the glue it is necessary to apply a pressure on the component for obtaining a good ohmic contact.

Figure 5:
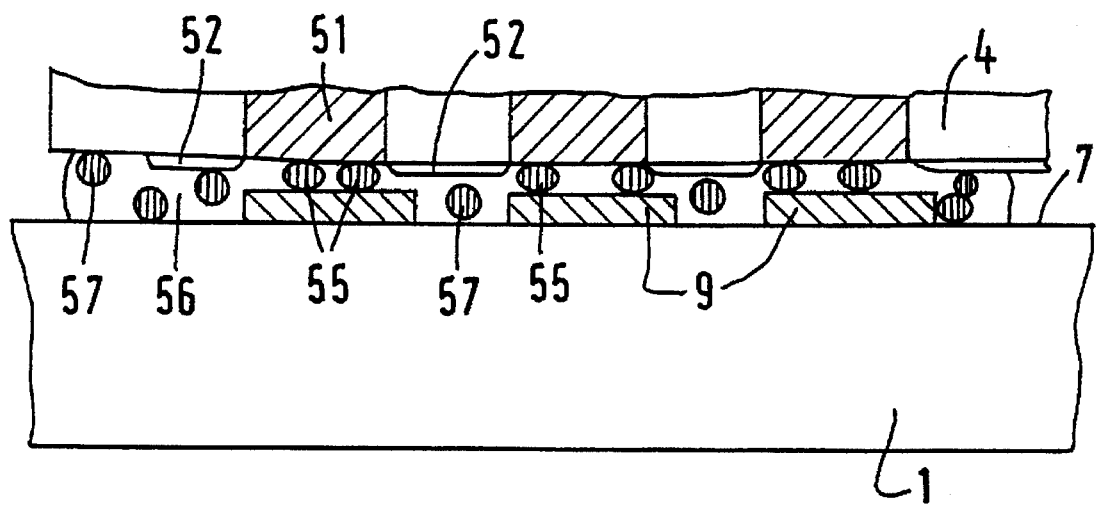
FIG. 5 shows in a partial broken-away cross-sectional view a preferred flip-chip mounting method for the integrated circuit in detail, with the use of an anisotropically conductive glue.

A preferred flip-chip mounting technique is shown in FIG. 5, though this is more critical than those indicated in the previous paragraph. Here the operation of providing elevations on the contacts of the chip may be dispensed with. The ends of the conductor tracks 9 on the bottom 7 of the cavity 5 may preferably still comprise elevations, which are preferably of cylindrical shape (41, FIG. 4A).

The glue used is a special anisotropically electrically conductive glue which is already used for surface mounting of passive components in particular. This type of glue contains conductive particles in a low concentration. These particles, which are elastically deformable and have a diameter of the order of 10 to 20 μm, provide electrical conduction when they are compressed between two contacts, whereas the glue remains insulating in locations where there are no contacts. Square metallizations with sides of 100 μm, interspaced by 100 μm, are compatible with the use of these glues as far as the conduction aspect is concerned (particle density present over the metallization at the moment of gluing—there must in fact be several particles present rather than a single one, which would theoretically be sufficient, for achieving a good contact—), while the risk of short-circuits between conductor tracks is excluded. These glues are at present available in the form of a foil (manufactured by the American 3M Company or the Japanese HITACHI Company) or in the form of a paste (manufactured by the American AIT and ZYMET Companies or the German LCD Mikroelektronic Company). UV-curing versions are also available. To implement the invention, the anisotropic glue in paste form is preferred to that in foil form. It will be noted that a compromise is to be found between the establishment of a good electrical conduction at the level of each contact of the chip and the absence of short-circuits caused by agglomerations of particles between tracks when this contacting technique is used. With the dimensioning of the contacts as an equal constraint, this compromise is easier to achieve in proportion as it is possible to increase the concentration of particles while decreasing their size. It is necessary, however, for rendering possible this smaller size, to achieve a good planeness of the set of track ends on the bottom 7 of the cavity (while that of the contacts of the integrated circuit is achieved otherwise). Another element which favours the absence of short-circuits between tracks is the accuracy which can be obtained in the configuration of the track ends and in the correct positioning of the integrated circuit during gluing: a good accuracy in these two respects renders it possible to make the ends of the tracks narrower and thus to increase the interspacings between tracks, which reduces the probability of short-circuits.

FIG. 5 shows in detail the connections made with anisotropic glue. The integrated circuit 4 is shown with its contacts 51 and a surface passivating layer 52 between contacts; the bottom 7 of the cavity in the card support 1 is provided with track ends 9 which in this case do not comprise elevations. In the gluing process combined with a certain pressure, conductive particles such as 55 have become trapped in the glue 56 and subsequently compressed between pairs of contacts 9 and 51. Other particles, such as 57, are situated outside the contacts and do not take part in any electrical conduction. During the gluing operation, the integrated circuit has been prepositioned so as to have its metallization pads (contacts) substantially aligned with the track ends (with or without elevations). A drop of anisotropic glue was deposited on the bottom of the cavity, and subsequently the integrated circuit was laid down and pressed onto the glue. The polymerization of the glue was subsequently effected, either by means of an oven or by means of a UV system (in the case of UV-curing resins).

As described above with reference to FIG. 1, the cavity 5 is subsequently filled up (not shown) in a simple potting operation. The simplicity of this operation renders possible the use of a system which fills several cavities at a time, thus leading to high manufacturing capacities per equipment unit. The resin used is preferably a resin of high ion purity which offers a good resistance to the absorption of humidity and effectively protects the integrated circuit chip during bending and torsion of the card.

It is to be noted that the use of a glue for gluing the chip and of a protective resin which are mutually compatible and have the same polymerization modes (thermal or UV) renders it possible to carry out the gluing operation for the chip and the filling operation for the cavity with the same equipment. The sequence of operations then is the following:

gluing of the chip, filling of the cavity by means of a resin dispenser mounted on the gluing equipment loader, simultaneous polymerization of the glue of the integrated circuit and of the enveloping resin. In this case, it is indeed recommended to prepolymerize the anisotropic glue before its application on the bottom of the cavity. In this case, a single piece of equipment is capable of realising the entire assembling operation.

We claim:

1. A method of manufacturing an electronic card having an electrically insulating card support provided with a cavity for accommodating an integrated circuit and, on one surface of said support, metal contact pads electrically connected to contacts of said integrated circuit, said method comprising the steps of:

(i) the application of electrical conductor tracks, all provided against the bottom and the lateral walls of said cavity and each connected to one of said metal contact pads arranged on the surface of the support which comprises said cavity, (ii) the realisation of electrical connections interconnecting the contacts of the integrated circuit positioned in the cavity and said conductor tracks at the bottom of the cavity, and (iii) filling up of said cavity with a protective resin which is subsequently polymerized.

2. A method as claimed in claim 1, wherein the step of applying the electrical conductor tracks consists in gluing the tracks under pressure and heat with a glue which is activated by heat (hot foil embossing method).

3. A method as claimed in claim 1, wherein the step of applying the electrical conductor tracks consists in the application of a catalyst in a pad printing process in accordance with a configuration desired for the tracks, followed by a metallization through autocatalysis.

4. A method as claimed in claim 1, wherein the step of applying the electrical conductor tracks consists in a 3-dimensional photolithography process utilizing a laser hologram.

5. A method as claimed in claim 1, wherein said step of realising the electrical connections consists in gluing of the integrated circuit with its base against the bottom of said cavity by means of a glue, followed by soldering of conductor wires between the contacts of the integrated circuit and the conductor tracks.

6. A method as claimed in claim 1, wherein the card support is realised, with its cavity, by an injection-moulding technique and comprises elevations at the bottom of the cavity in locations designed for the ends of the conductor tracks.

7. A method as claimed in claim 1, wherein said step of realising the electrical connections is carried out by a flip-chip integrated circuit mounting technique selected from the group consisting of soldering, insulating glue, and conductive glue in defined locations; the contacts of the integrated circuit being provided with elevations.

8. A process as claimed in claim 1, wherein said step of realising the electrical connections is carried out by a flip-chip integrated circuit mounting technique consisting of gluing in combination with pressure, the glue being anisotropically electrically conductive and in a form selected from the group consisting of a pre-shaped foil and a paste; the contacts of the integrated circuit being without elevations.

9. A method as claimed in claim 8, wherein said anisotropically electrically conductive glue is prepolymerized before the step of realising the electrical connections, and wherein its final polymerization is carried out simultaneously with that of said protective resin.

* * * * *